(12) United States Patent
Osajda et al.

(10) Patent No.: US 6,214,634 B1
(45) Date of Patent: Apr. 10, 2001

(54) SENSOR DEVICE AND METHOD OF FORMING A SENSOR DEVICE

(75) Inventors: Marc Osajda, Toulouse; Eric Perraud, Tournefeuille, both of (FR)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/424,125

(22) PCT Filed: May 28, 1998

(86) PCT No.: PCT/EP98/03192

§ 371 Date: Feb. 7, 2000

§ 102(e) Date: Feb. 7, 2000

(87) PCT Pub. No.: WO98/54556

PCT Pub. Date: Dec. 3, 1998

(30) Foreign Application Priority Data

May 28, 1997 (FR) .................................................. 97 06523

(51) Int. Cl.[7] .................................................. H01L 21/00
(52) U.S. Cl. .................. 438/50; 438/50; 438/51; 438/53; 73/706; 73/715; 73/723; 73/754; 73/756; 338/4; 338/42; 600/485; 600/486; 600/487; 600/488
(58) Field of Search .................. 73/706, 715, 723, 73/725, 726, 727, 756, 754; 338/4, 12; 600/485–488; 438/50

(56) References Cited

U.S. PATENT DOCUMENTS

| | | | |
|---|---|---|---|
| 4,732,042 | * 3/1988 | Adams | 73/706 |
| 4,809,704 | * 3/1989 | Sogawa et al. | 600/488 |
| 5,461,922 | * 10/1995 | Koen | 73/756 |
| 5,554,113 | * 9/1996 | Novak et al. | 604/30 |
| 5,752,918 | * 5/1998 | Fowler et al. | 600/488 |
| 6,117,086 | * 9/2000 | Shulze | 600/488 |

FOREIGN PATENT DOCUMENTS

| | | | |
|---|---|---|---|
| 2667395 | * 4/1992 | (FR) | G01L/9/06 |
| 2686692 | * 7/1993 | (FR) | H01L/41/113 |

* cited by examiner

Primary Examiner—Charles Bowers
Assistant Examiner—Asok Unmar Sarkar
(74) Attorney, Agent, or Firm—Robert F. Hightower; A. Kate Huffman

(57) ABSTRACT

A sensor device (20) comprises a sensor package (22) having a cavity (24) formed therein, a sensor die (26) mounted on a bottom surface (28) of the cavity (24) and a protective coating (30) formed over the sensor die in the cavity. The protective coating (30) is formed from a material, preferably a polymer material, which is arranged to have a graduated cross-linking density such that the material at the top of the cavity (24) has a high density of cross-linking and the material at the bottom of the cavity (24), which material is in contact with the sensor die, has a low density of cross-linking.

20 Claims, 3 Drawing Sheets

TIME FOR PACKAGE INTERIOR TO
REACH 50% OF EXTERIOR HUMIDITY

SENSOR DEVICE AND METHOD OF FORMING A SENSOR DEVICE

FIELD OF THE INVENTION

This invention relates to sensor devices and a method of forming sensor devices.

BACKGROUND OF THE INVENTION

A characteristic of semiconductor sensor devices is that the sensing element on the semiconductor die must be in contact with the media to be sensed. However, as for all semiconductors, it is necessary to protect the sensor die from humidity, dust particles, light etc. so some sort of barrier is required to protect the sensor die.

Any barrier between the sensor die and the media can limit the device' performance and specifically sensitivity. For example, in the case when the barrier shows very good adhesion to the sensor die and device packaging so as to limit the penetration of the water, steam etc. at the interface between the barrier and packaging, any mismatch in the Coefficient of Thermal Expansion (CTE) between the sensor die and the barrier creates unwanted stress and shift in the electrical parameters and hence reduces the accuracy of the sensor device. The barrier must therefore be selected carefully.

In the case of a pressure sensor, since the sensor die must be exposed to pressure, a hard material, such as molded epoxy, cannot be used to protect the die. Thus, a very soft silicon gel is used, as for example in the MPX series of pressure sensor devices (e.g. MPX2200D) supplied by Motorola, Inc., which gel is able to transmit the pressure to the sensor die.

The silicon gel is however very permeable to water and steam which means that after a short period of time water comes into contact with the sensor die, the bonding pads and connecting wires of the pressure sensor which causes the pressure sensor to fail.

Since the number of applications which need to sense the pressure of fluids or of vapours, and also the markets for such applications, are increasing, there is a real interest to provide low cost pressures sensors which are compatible with aqueous solutions.

It has been proposed to use a polyparaxylylene coating, such as a Parylene* coating (*Parylene is a trademark of Union Carbide Inc.), to protect the semiconductor die and wires from water. However, the process required to manufacture a pressure sensor with such a coating is very complex. In addition, the coating creates significant and non-linear mechanical stress on the sensor die which, for pressure sensors, must be compensated for in order to avoid inaccurate pressure measurements. However, the induced stress is random, so it is difficult to provide accurate compensation electronically, especially at low pressures.

Another technique which addresses the aqueous solution compatibility problem is describe in UK patent application GA-A-2266151. This technique uses an intermediate barrier between the sensor die and the media and an oil or a gel, which is not compressible (typically silicon oil), in the gap between the sensor die and the barrier to transmit the pressure to the sensor die. The barrier is formed from material which is resistant to water, such as stainless steel, resistant rubber, ceramic.

This technique works well but requires special housing with several seals making the final sensor device expensive. In addition, the process and assembly for such a device is complex, requires many manual operations (such as gel filling) and is not easy to implement in high volume production.

There is therefore a need to provide an improved sensor device which is substantially impermeable to aqueous solutions and other contaminants and which address the above mentioned problems.

SUMMARY OF THE INVENTION

In accordance with a first aspect of the present invention there is provided a sensor device as recited in claim 1 or 3 of the accompanying claims.

In accordance with a second aspect of the present invention there is provided a method of forming a sensor device as recited in claim 8 or 11 of the accompanying claims.

BRIEF DESCRIPTION OF THE DRAWINGS

A sensor device in accordance with the present invention and a method of forming a sensor device in accordance with the present invention will now be described, by way of example, with reference to the accompanying drawings in which.

DETAILED DESCRIPTION OF THE DRAWINGS

The present invention will be described in the following with reference to a pressure sensor. It will however be appreciated that the invention may also be applied to other types of sensors which are sensitive to stress, such as accelerometers. In other words, the present invention provides distinct advantages for those sensors which must use a liquid-type medium, which medium transfers the stress to be sensed to the die, to protect the sensor die.

Figure 1:
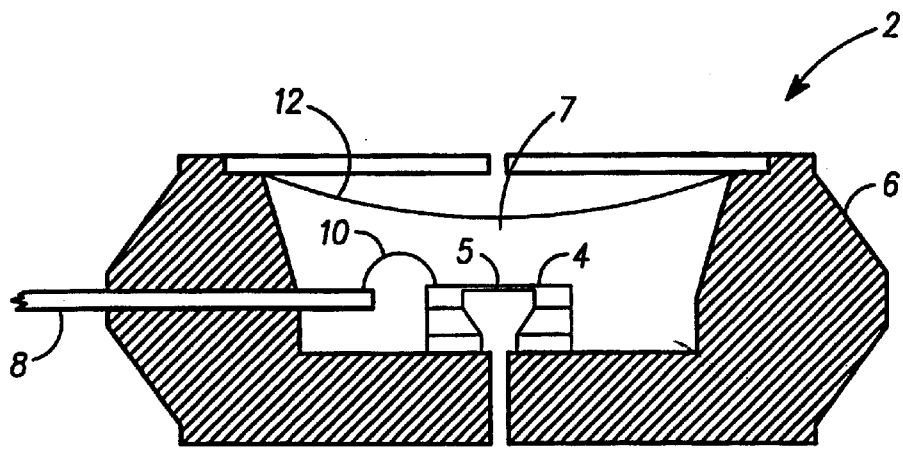
FIG. 1 is a cross-sectional schematic diagram of a prior art sensor device.

Referring firstly to FIG. 1, a silicon pressure sensor device 2, such as the MPX2200D pressure sensor supplied by Motorola, Inc., comprises a sensor die 4 bonded to a premolded package 6. The premolded package 6 has a cavity 7 in which the sensor die 4 is located. Electrical connection is made via gold wires 10 between the sensor die 4 and a leadframe 8 of the sensor device 2.

In order to protect the sensor die 4 from humidity, dust particles, light etc., a soft silicon gel 12 is formed over the sensor die 4 and gold wires 10 in the cavity 7. The pressures to be sensed by the sensor device 2 are transmitted to the sensor die 4 through the soft silicon gel 12.

The sensor die 4 comprises a silicon micro-machined diaphragm 5. When pressures is applied, the diaphragm 5 is stressed and the deformation is determined by a strain gauge (not shown). If there is a difference between the CTE of the gel and the diaphragm 5, unwanted stress may be created which will cause drifts in the electrical signal and so will reduce the accuracy of the sensor device 2.

A further drawbacks of gels, as mentioned in the introduction, is that they are very permeable to water and steam. Once water has come into contact with the gel, it takes only a short period of time, for the water to permeate through the gel 12 and to come into contact with the sensor die 4, the bonding pads (not shown) on the sensor die 4 and the gold wires 10. The result is that electrocorrosion failure occurs in a very short time.

Figure 2:
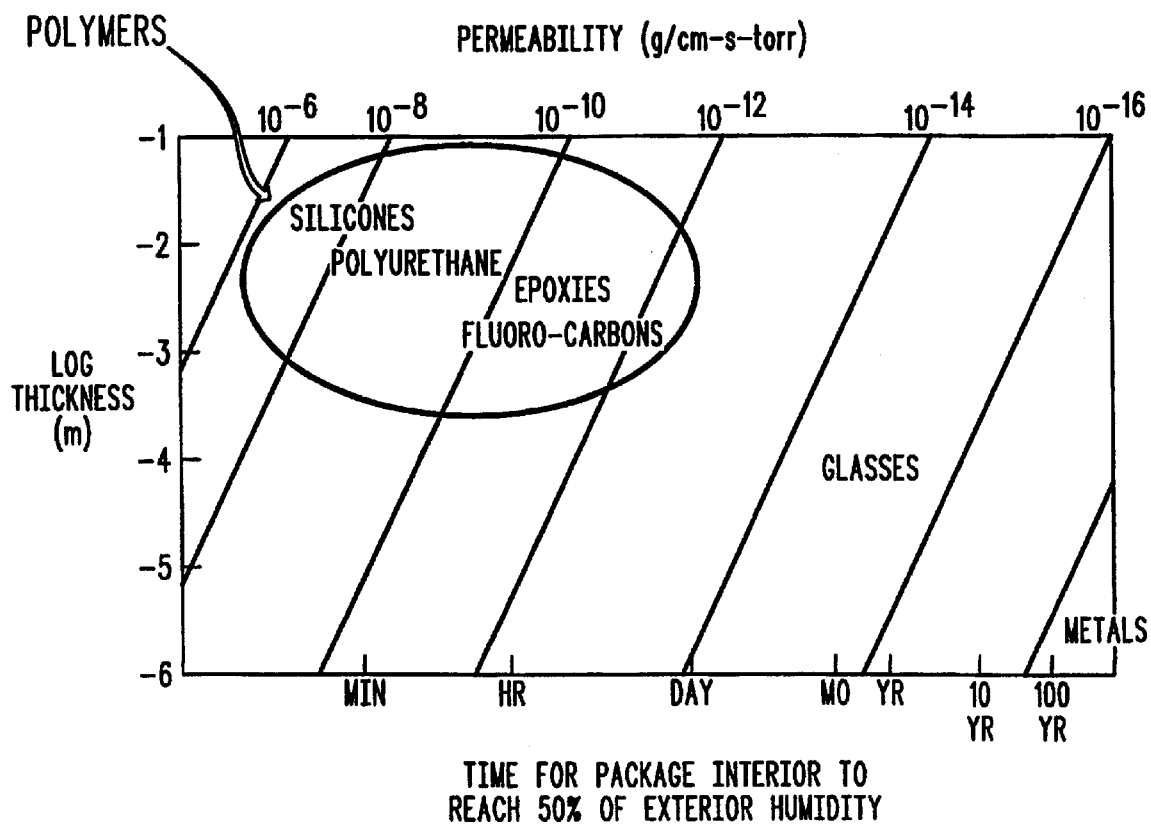
FIG. 2 is a graphical representation showing the permeability of different types of material.

Protective coatings made from different kinds of material would all be permeable after defined times. As can be seen from the graph in FIG. 2, the defined times are in the range of minutes and hours for polymers and years for steel or glasses. The structure of the material of the protective coating, the geometry of the protective coating, the processing of the protective coating and whether or not the penetration is in the bulk of the coating or at an interface are some of the factors that influence the permeability of the protective coating. The environment can also accelerate permeation. For example, the presence of specific chemicals (solvent), and/or elevated temperatures, and/or pressures can accelerate permeation.

Permeability of a material is reduced with increased cross-linking density or in other words as the number of links between the molecules of the material increases. With high density cross-linking, there is only a limited number of paths for water (or solvent) molecules. Cross-linking density is influenced by the molecular weight and reactivity of the starting raw material. Reactivity is the ability of the basic molecule to cross-link with another molecule. Low molecular weight and high reactivity provides high density cross-linking.

Theoretically, the cross-linking density of a material can vary from 0% to 100%: 0% means no cross-links and 100% means that all the reactive sites on all the molecules are connected together. Practically, it is not possible for a material to have 0% cross-linking density since there will always be some links in the raw materials as some sites are extremely reactive and unstable. Conversely, it is not possible to have a material with 100% cross-linking density because some sites are not reactive enough. The term high density of cross-linking as used herein thus means a cross-linking density which is substantially 100% (i.e. everything has been done to cross-link all the possible reactive sites together). The term low density of cross-linking as used herein means a density which is lower than that of the high density of cross-linking.

Silicon gels have high molecular weight and low reactivity and so are particularly permeable due to the very low density of cross-linking and the large material net structure which results. For such large structures, water molecules can pass very easily through the gel.

Although materials having a high density of cross-linking have reduced permeability, such materials may induce significant stress on the sensor die if used as the protective coating.

The present invention provides a protective coating for the sensor die which has decreased permeability, which reduces the possibility of stress being applied to the sensor die but which does not reduce the sensitivity of the sensor device.

Figure 3:
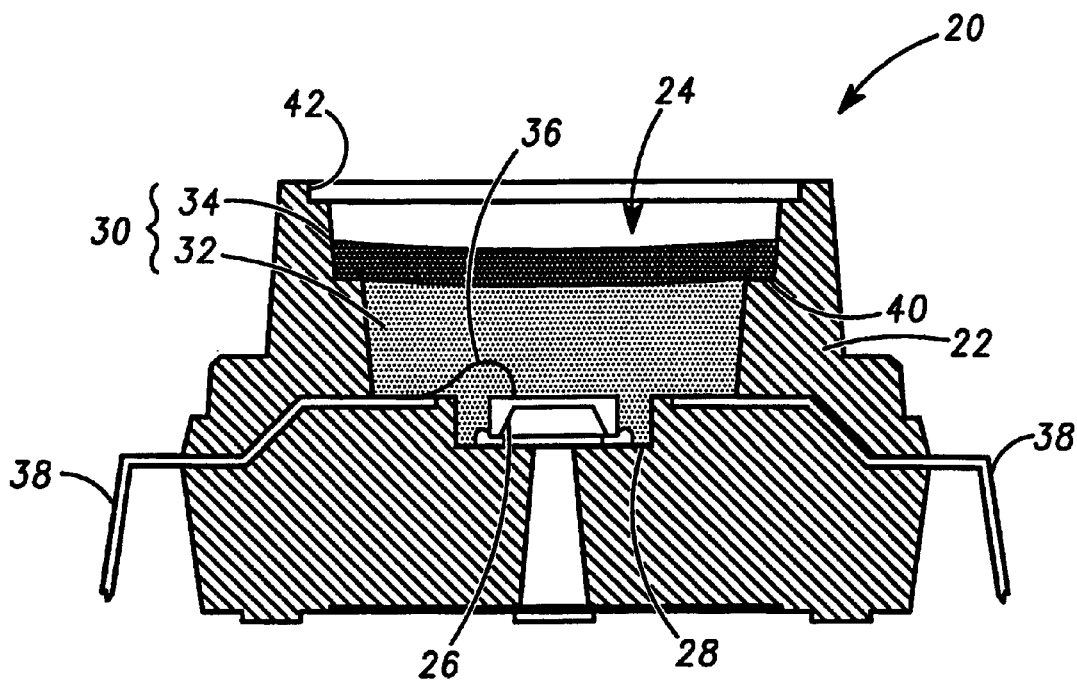
FIG. 3 is a cross-sectional schematic diagram of a sensor device in accordance with the present invention.

Referring now to FIG. 3, a sensor device 20 in accordance with a preferred embodiment of the present invention comprises packaging means or sensor package 22, which is preferably a premolded epoxy case, having a cavity 24 therein, a sensor die 26 mounted on a bottom surface 28 of the cavity 24 and a protective coating 30 formed over the sensor die 26 in the cavity 24.

The protective coating in accordance with the present invention comprises a material having a graduated cross-linking density. At the top of the cavity 24, the material is arranged to have a high cross-linking density and at the bottom of the cavity 24, where it is in contact with the sensor die 26, the material is arranged to have a low density of cross-linking. In between, the cross-linking density of the material depends on the reactive process which produces the graduated cross-linking density.

In the preferred embodiment shown in FIG. 3, the protective coating 30 comprises a bottom layer 32 of uncured polymer material formed over the die and a top layer 34 of the same but cured polymer material formed over the bottom layer 32.

As the top layer 34 of the protective coating in accordance with the preferred embodiment is formed of cured polymer material, the top layer 34 has a high density of cross-linking which provides an efficient barrier against water, steam and other contaminants compared to silicon gels; due to the high density cross-linking, the path for the water molecules is significantly reduced.

By contrast, as the bottom layer 32 is formed of uncured polymer material, the layer in contact with the sensor die 26 has no cross-linking or a very low density of cross-linking so that the polymer material stays in a liquid state. The 'soft' bottom layer 32 thus ensures that the stress on the sensor die 26 is limited compared to the known conformal coatings. Furthermore, since in the preferred embodiment only one polymer is used to create the top and bottom layers, the invention is easy to implement and provides a low cost solution compared to the complex and expensive prior art solutions mentioned above.

In the preferred embodiment, the protective coating 30 is formed from polymer material. However, the invention can be implemented using any material that can be changed by an irreversible chemical reaction from a phase one state to a phase two state, where the phase one state is preferably a liquid state and the phase two state is preferably a solid, using a reactive agent, such as radiation energy and/or a chemical catalyst.

Electrical connection is made via gold wires 36 between the sensor die 26 and a leadframe 38 of the sensor device 20. In the embodiment shown in FIG. 3, the sensor device 20 is a pressure sensor device.

In the preferred embodiment, a groove 40 is made in an inside wall of the cavity 24 near the top 42 of the cavity 24 such that when the sensor device 2 is assembled (as shown in FIG. 3), the top layer 34 extends into the groove 40. Preferably, the groove 40 extends round all the cavity 24. The co-operation of the groove 40 and the top layer 34 aids in providing a good seal between the protective coating 30 and the packaging 22.

A method of forming a sensor device in accordance with a preferred embodiment of the present invention, such as the sensor device 20 of FIG. 3, will now be described with reference to FIGS. 3 to 5.

Figure 4:
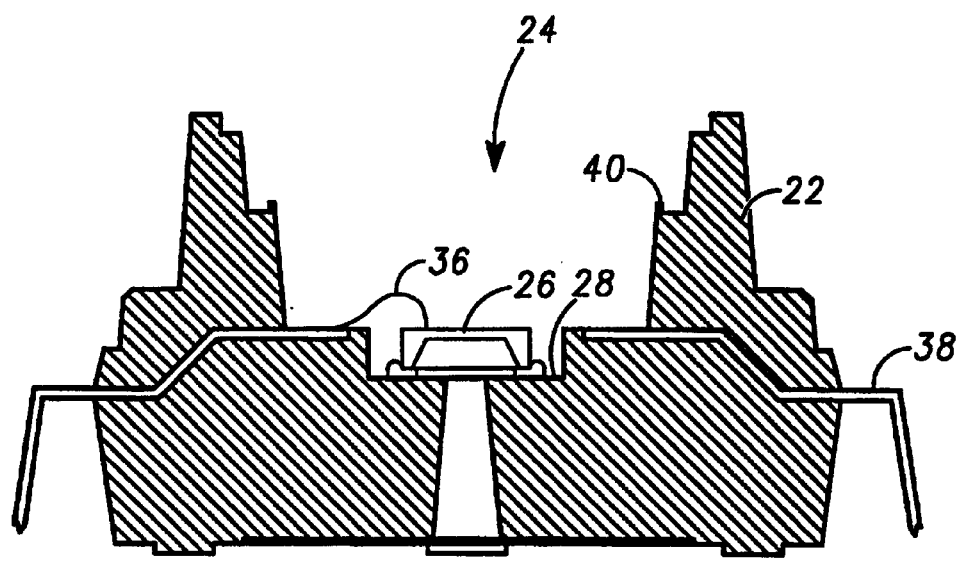
FIGS. 4 and 5 are cross-sectional schematic diagrams showing the sensor device of FIG. 3 during different stages of fabrication.
Figure 5:
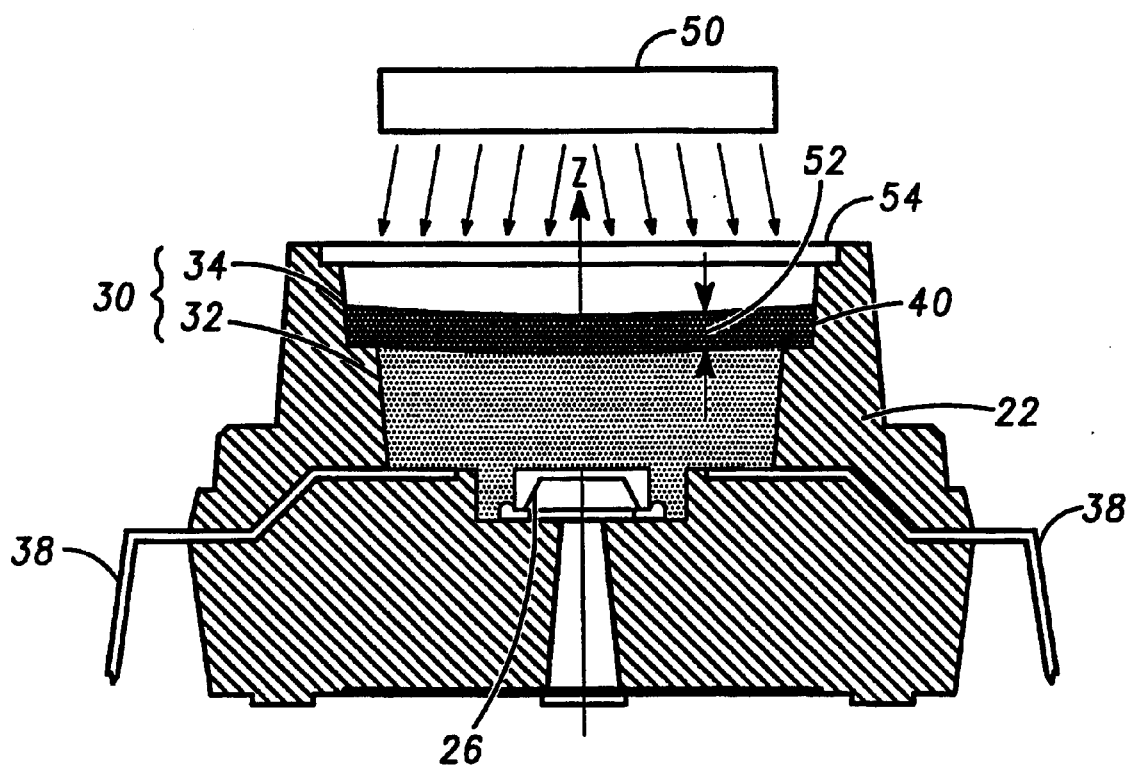

Referring firstly to FIGS. 3 and 4, the sensor package 22, which in the preferred embodiment is a premolded package, is provided encapsulating part of the lead frame 38 and having a cavity 24 formed therein. The silicon die 26 is bonded, preferably with soft Room Temperature Vulcanization (RTV), to a bottom surface 28 of the package 22 and the sensor die 26 is connected to the lead frame 38 via gold wires 36.

These steps are well known, for example they are used now in the fabrication of the MPX series of pressure sensor devices supplied by Motorola, Inc. and so no additional details will be given herein.

Optionally, the sensor package 22 may be provided with a groove 40 round the inside wall of the cavity 24 near the top of the cavity 24.

A liquid comprising a polymer material is then introduced into the cavity 24 such that it covers the sensor die 26. The surface of the liquid is then exposed to a source of energy 50, such as a source of radiation, for a predetermined time Te so that a protective coating 30 is formed over the die 26 in the cavity 24 having a graduated cross-linking density in the Z direction (see FIG. 5). At the top of the cavity 24, the cross-linking density is higher than at the bottom of the cavity 24. In the preferred embodiment, the protective coating 30 comprises a bottom layer 32 formed of uncured polymer material and formed over and in contact with the die 26 and a top layer 34 formed of cured polymer material and formed over the bottom layer 32.

The cavity 54 may then be closed by an optional steel cap 54 fitted in the top of the cavity 54.

The source of energy 50 is preferably a source of UV radiation since UV sources are already used in semiconductor fabrication processes and electron beams are expensive. Preferably, the source of UV radiation is selected so that the wavelength of the UV is not in the visible spectrum. This ensures that the polymer does not continue to cure after exposure to the UV radiation. The UV radiation is focused, using for example an optical fiber (not shown), onto the liquid in the cavity 24.

The level of the cross-linking density of the material varies from the top of the cavity to the bottom of the cavity (i.e. in the Z direction) according to the predetermined time Te and the level of energy of the energy source. For the preferred embodiment, this means that the thickness 52 of the top layer 34 depends on the predetermined time Te during which the liquid in the cavity 24 is exposed to the UV radiation and the intensity of the UV source. The optimum thickness 52 is in the range of 0.6 mm to 1 mm: below 0.6 mm, the top layer 34 is too thin and can easily be destroyed and above 1 mm, the top layer 34 is thick enough to reduce sensitivity of the sensor device 20.

In the alternative embodiment (not shown), the curing process is arranged so that the curing depth is modulated across the cavity 24. This produces a protective coating having a top layer of high cross-linking density with a greater thickness at the edges than at the centre. Having a greater thickness at the edges provides better adhesion of the protective layer to the sensor package.

Preferably, the liquid contains the raw polymer material and a photo initiator such that a free radical curing process takes place. The photo initiator is chosen so that when it is exposed to UV radiation, energetically excited compounds, known as free radicals, are generated which couple to molecules to form cross-links and hence which produce the curing reaction in the liquid. When the UV source is turned off, since the free radicals have an extremely short lifetime, the free radical curing process stops. This ensures that the polymer material does not continue to cure after exposure to the UV radiation, which means that the thickness 52 of the top layer 34 can be easily controlled.

Alternatively, the cavity 24 may be filled substantially with a liquid containing a polymer material and then a layer of photo initiator is formed on top of the liquid. The UV radiation is then focused on the layer of photo initiator such that free radicals are generated as described above.

The controllability of the UV free radical curing process provides distinct advantages over other curing processes such as a cationic curing process and thermal curing. For both these latter processes, once the curing process has started, it cannot be stopped. This means that if either of these processes were used to cure the liquid in cavity 24, the end result would be that the whole of the liquid in the cavity 24 would be cured.

A further advantage of a UV free radical curing process compared to a thermal curing process is that UV free radical curing is much quicker. As the free radicals generated by the UV radiation have a short lifetime, free radically curing can take place in say 2 seconds compared to 1 hour for thermal curing.

In order to provide good protection for the sensor die 26 whilst not reducing the performance of the sensor device 20, the polymer material from which the top 34 and bottom 32 layers are formed should be selected so that the protective coating 30 has low permeability to water and solvent, good adhesion to the sensor package 22, good resistance to various chemicals and should be easy to cure and cross-link. The following polymers were found to be suitable materials: vinyl ether, urethane, acrylated epoxy. Acrylated epoxy is preferred because of its high reactivity (good cross-linking), excellent chemical resistance and good adhesion properties.

One example of carrying out the method in accordance with the present invention is given below.

The cavity 24 is filled with a liquid such as the modified epoxy OG133 formulation supplied by Epoxy Technology Inc. The OG133 is a ready-to-use formulation comprising raw material and the photo initiator as well as some other additives used to optimise the final properties such as mechanical resistance and/or adhesion.

A high intensity (1.1 watt) ultraviolet (UV) radiation source is used to generate UV radiation having a wavelength of 365 nm which is then focused onto the surface of the liquid in the cavity 24 for a predetermined time Te of 2 minutes. A protective coating 30 is formed over the sensor die 26 comprising a top layer 34 of cured epoxy having a thickness 52 of 0.6 mm and a bottom layer 32 of uncured epoxy which is in a liquid state.

Thus, the present invention provides a protective coating for the sensor die having a cross-linking gradient which at the interface with the media has a high level of cross-linking with good adhesion to the sensor package but which at the area in contact with the die has low or no cross-linking. This ensures that the protective coating has reduced permeability at the interface and that the die is isolated from direct stress.

Since the top and bottom layers of the protective coating are formed from the same initial polymer material by simply exposing the polymer material to a source of energy, the present invention is easy and relatively inexpensive to implement compared to the known complicated packaging and assembly steps mentioned in the introduction.

What is claimed is:

1. A sensor device comprising:

sensor packaging means having a cavity formed therein;

a sensor die mounted on a bottom surface of the cavity; and a protective coating formed over the sensor die in the cavity, wherein the protective coating is formed from a material having a graduated cross-linking density such that the material at the top of the cavity has a high density of cross-linking and the material at the bottom of the cavity, which material is in contact with the sensor die, has a low density of cross-linking.

2. A sensor device according to claim 1 wherein the material is a polymer material.

3. A sensor device comprising:

sensor packaging means having a cavity formed therein;

a sensor die mounted on a bottom surface of the cavity; and a protective coating formed over the sensor die in the cavity, wherein the protective coating comprises:
  a bottom layer formed over the die, the bottom layer being formed of uncured polymer material; and
  a top layer formed over the bottom layer, the top layer being formed of cured polymer material.

4. A sensor device according to claim 3 further comprising a groove formed in an inside wall of the cavity and wherein part of the top layer extends into the groove.

5. A sensor device according to claim 3 or 4 wherein the top layer has a thickness which varies across the cavity such that the top layer is thinner at the centre of the cavity than at the edges.

6. A sensor device according to claim 3 or 4 wherein the top layer has a thickness which is in the range of 0.6 mm to 1.0 mm.

7. A sensor device according to claim 3, 4, 5 or 6 wherein the polymer material is a polymer selected from one of the following:
  urethane, vynil ether, and acryllated epoxy.

8. A method of forming a sensor device comprising the steps of:
  providing sensor packaging means having a cavity formed therein;
  mounting a sensor die on a bottom surface of the cavity;
  introducing a liquid comprising a material into the cavity such that it covers the sensor die; and
  exposing a surface of the liquid to a source of energy for a predetermined time until the material has a graduated cross-linking density with the material at the top of the cavity having a high density of cross-linking and the material at the bottom of the cavity, which material is in contact with the sensor die, having a low density of cross-linking, wherein the graduated material provides a protective coating over the sensor die in the cavity.

9. A method according to claim 8 wherein the level of the cross-linking density of the material varies from the top of the cavity to the bottom of the cavity according to the predetermined time and the level of energy of the energy source.

10. A method according to claim 8 or 9 wherein the material is a polymer material.

11. A method of forming a sensor device comprising the steps of:
  providing sensor packaging means having a cavity formed therein;
  mounting a sensor die on a bottom surface of the cavity;
  introducing a liquid comprising a polymer material into the cavity such that it covers the sensor die; and
  exposing a surface of the liquid to a source of energy for a predetermined time so as to cure a portion of the polymer material, wherein a protective coating is formed over the sensor die in the cavity comprising:
    a bottom layer formed over the sensor die and being formed of uncured polymer material; and
    a top layer formed over the bottom layer and being formed of cured polymer material.

12. A method according to claim 11 wherein the top layer has a thickness which depends on the predetermined time and the level of energy of the energy source.

13. A method according to claim 12 wherein the thickness varies across the cavity such that the top layer is thinner at the centre of the cavity than at the edges.

14. A method according to claim 12 wherein the thickness of the top layer is in the range of 0.6 mm to 1.0 mm.

15. A method according to claim 8, 9, 10, 11, 12, 13, or 14 wherein the source of energy is a source of radiation.

16. A method according to claim 15 wherein the source of radiation provides radiation having a wavelength which is not in the visible spectrum.

17. A method according to claim 8, 9, 10, 11, 12, 13, 14, 15 or 16 wherein the source of energy is a source of UV radiation.

18. A method according to claim 17 wherein the introducing step comprises introducing into the cavity a liquid comprising polymer material and a photo initiator, the photo initiator comprising a material which generates free radicals in the presence of UV radiation.

19. A method according to claim 17 further comprising the step of forming a layer of photo initiator over the liquid, the photo initiator layer being formed of a material which generates free radicals in the presence of UV radiation and wherein the exposing step comprises exposing the photo initiator layer to the UV radiation.

20. A method according to claim 11 wherein the polymer material is a polymer selected from one of the following:
  urethane, vinyl ether, and acrylated epoxy.

* * * * *

UNITED STATES PATENT AND TRADEMARK OFFICE
CERTIFICATE OF CORRECTION

PATENT NO.    : 6,214,634 B1
DATED         : April 10, 2001
INVENTOR(S)   : Marc Osajda et al.

It is certified that error appears in the above-identified patent and that said Letters Patent is hereby corrected as shown below:

<u>Column 7,</u>
Line 20, delete "vynil" and add -- vinyl --.

Signed and Sealed this

Fourth Day of June, 2002

*Attest:*

JAMES E. ROGAN
*Director of the United States Patent and Trademark Office*

*Attesting Officer*